United States Patent
Lee

(10) Patent No.: US 7,179,713 B2
(45) Date of Patent: Feb. 20, 2007

(54) METHOD OF FABRICATING A FIN TRANSISTOR

(75) Inventor: Byeong Ryeol Lee, Seoul (KR)

(73) Assignee: Dongbu Electronics Co., Ltd., Seoul (KR)

( * ) Notice: Subject to any disclaimer, the term of this patent is extended or adjusted under 35 U.S.C. 154(b) by 0 days.

(21) Appl. No.: 11/025,244

(22) Filed: Dec. 28, 2004

(65) Prior Publication Data
US 2005/0142780 A1 Jun. 30, 2005

(30) Foreign Application Priority Data
Dec. 30, 2003 (KR) .................. 10-2003-0100535

(51) Int. Cl.
*H01L 21/336* (2006.01)
(52) U.S. Cl. .................. 438/279; 438/283; 438/284
(58) Field of Classification Search .............. 438/279, 438/283, 284
See application file for complete search history.

(56) References Cited

U.S. PATENT DOCUMENTS

| 6,835,609 B1 * | 12/2004 | Lee et al. ................ 438/183 |
|---|---|---|
| 6,855,583 B1 * | 2/2005 | Krivokapic et al. ........ 438/157 |
| 6,864,164 B1 * | 3/2005 | Dakshina-Murthy et al. .... 438/585 |
| 6,916,694 B2 * | 7/2005 | Hanafi et al. ............... 438/166 |
| 2002/0153587 A1 * | 10/2002 | Adkisson et al. ........... 257/510 |

* cited by examiner

*Primary Examiner*—Trung Dang
(74) *Attorney, Agent, or Firm*—Andrew D. Fortney

(57) ABSTRACT

A method of fabricating a fin transistor is disclosed. An example method stacks a mask oxide layer and a nitride layer on a semiconductor substrate, forms a fin by etching the nitride and mask oxide layers and silicon, forms an insulating oxide layer, and forms a gate electrode by etching the insulating oxide layer corresponding to a gate forming area using a gate mask, by forming a gate oxide layer on a sidewall of the silicon exposed by the etch and burying a metal. The example method also removes the remaining insulating oxide layer using an etch rate difference, forms a gate spacer, and forms source/drain regions in the silicon substrate to be aligned with the gate electrode. Additionally, the example method forms a second insulating oxide layer over the substrate, etches the second insulating oxide layer using a metal mask, forms contact holes on the source/drain regions, respectively, and fills the contact holes and the portion etched via the metal mask with a metal.

9 Claims, 9 Drawing Sheets

METHOD OF FABRICATING A FIN TRANSISTOR

RELATED APPLICATION

This application claims the benefit of Korean Application No. P2003-0100535 filed on Dec. 30, 2003, which is hereby incorporated herein by reference in its entirety.

TECHNICAL FIELD

The present disclosure relates to a semiconductor device and, more particularly, to a method of fabricating a fin transistor.

BACKGROUND

Generally, a pitch of a semiconductor device is shortened according to a decreasing design rule of the semiconductor device, whereby a channel length of a transistor is considerably reduced. Specifically, as a gate length is reduced below 0.13 µm, efforts in connection with shallow junction and super steep channel doping have increased. Specifically, many efforts have been directed to development of fin transistors.

FIGS. 1 to 3 are layout and cross-sectional diagrams, respectively, of a known fin transistor. Referring to FIGS. 1 to 3, in a fin transistor fabricated by a known fabrication method, a contact hole connected to a gate is not allowed to lie on an active area. Thus, the known method has difficulty in fitting a design rule, thereby being disadvantageous in implementing a high degree of integration in a semiconductor device.

DETAILED DESCRIPTION

In general, the example method described herein provides a method of fabricating a fin transistor, by which a fin type MOS transistor having a buried self-aligned metal gate is fabricated. One example method includes stacking a mask oxide layer and a nitride layer on a semiconductor substrate, forming a fin by etching the nitride and mask oxide layers and silicon, forming an insulating oxide layer thereon, forming a gate electrode by etching the insulating oxide layer corresponding to a gate forming area using a gate mask, by forming a gate oxide layer on a sidewall of the silicon exposed by the etch, and by burying a metal, removing the remaining insulating oxide layer using an etch rate difference, forming a gate spacer, forming source/drain regions in the silicon substrate to be aligned with the gate electrode, forming a second insulating oxide layer over the substrate, etching the second insulating oxide layer using a metal mask, forming contact holes on the source/drain regions, respectively, filling the contact holes and the portion etched via the metal mask with a metal, and planarizing the metal.

Preferably, the semiconductor substrate is either an SOI substrate or a substrate comprising a first conductive silicon substrate, a buried oxide layer on the first conductive type silicon substrate, and a polysilicon on the buried oxide layer. Also, preferably, the gate mask is a contact hole type mask, and the portion etched via the gate mask is filled up with either W or Mo.

Figure 10:
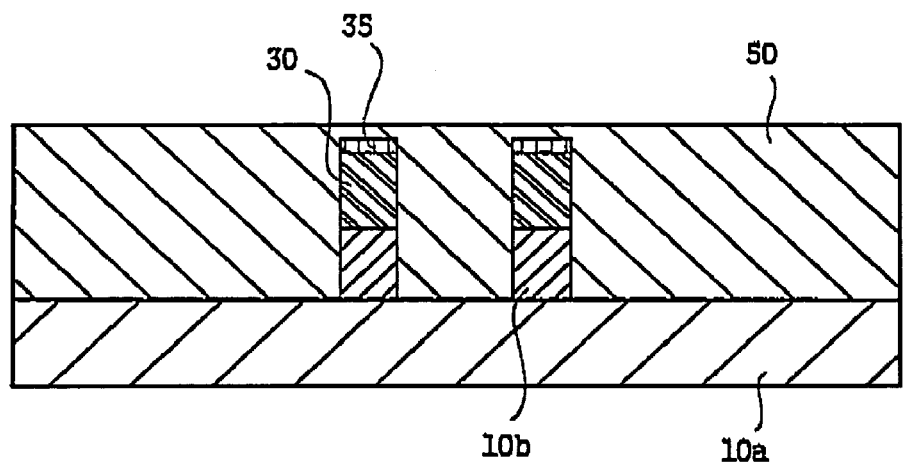
FIGS. 10 to 13 are cross-sectional diagrams showing a method of fabricating a fin transistor, along the view of FIG. 5.
Figure 11:
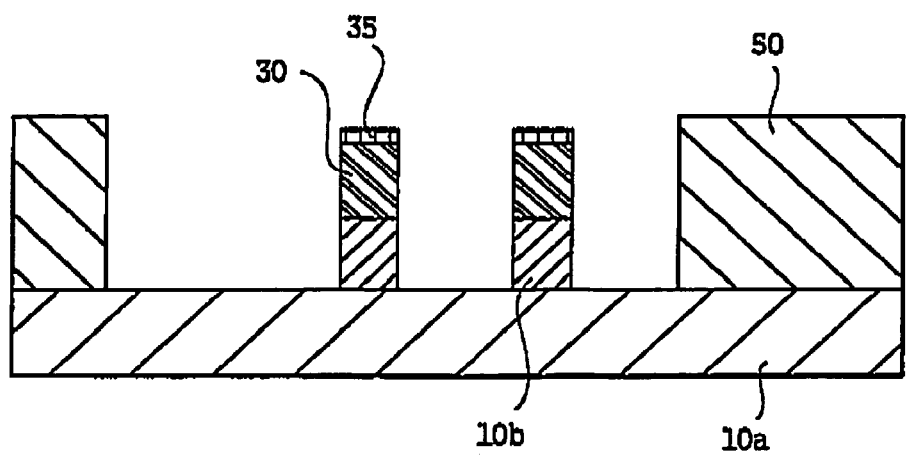
Figure 12:
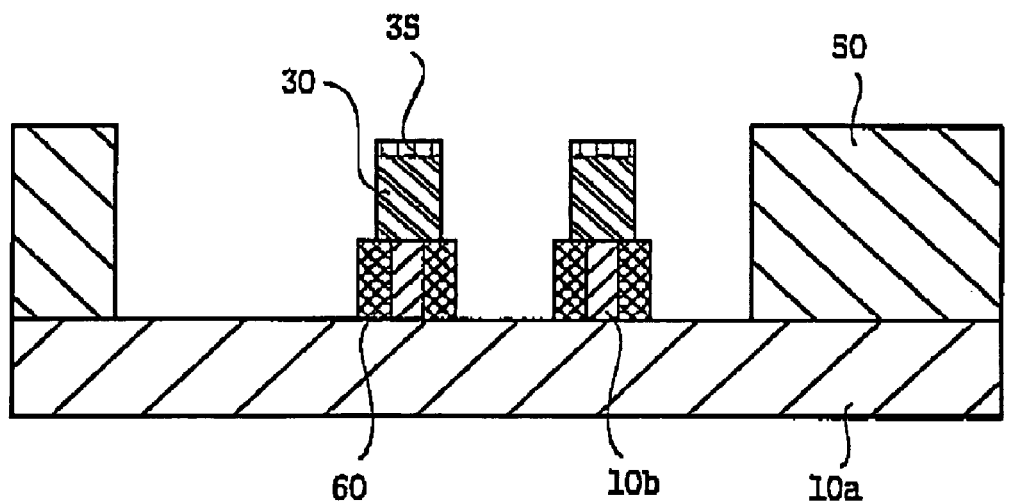
Figure 13:
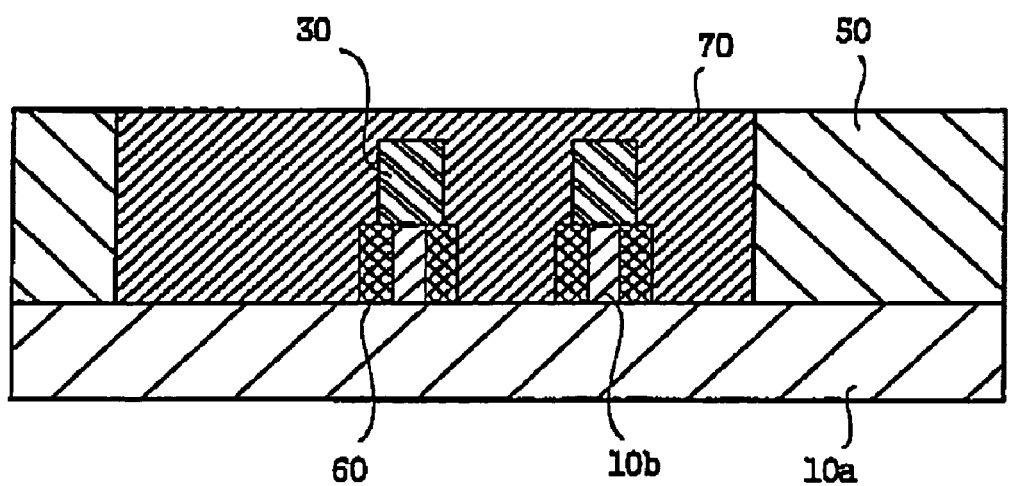
Figure 14:
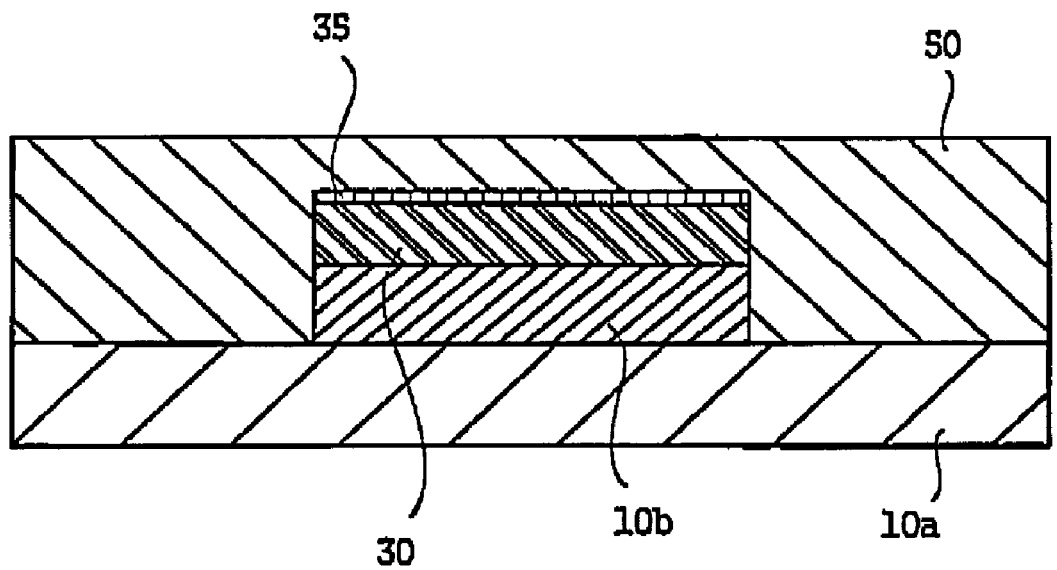
FIGS. 14 to 17 are cross-sectional diagrams showing a method of fabricating a fin transistor, along the view of FIG. 6.
Figure 15:
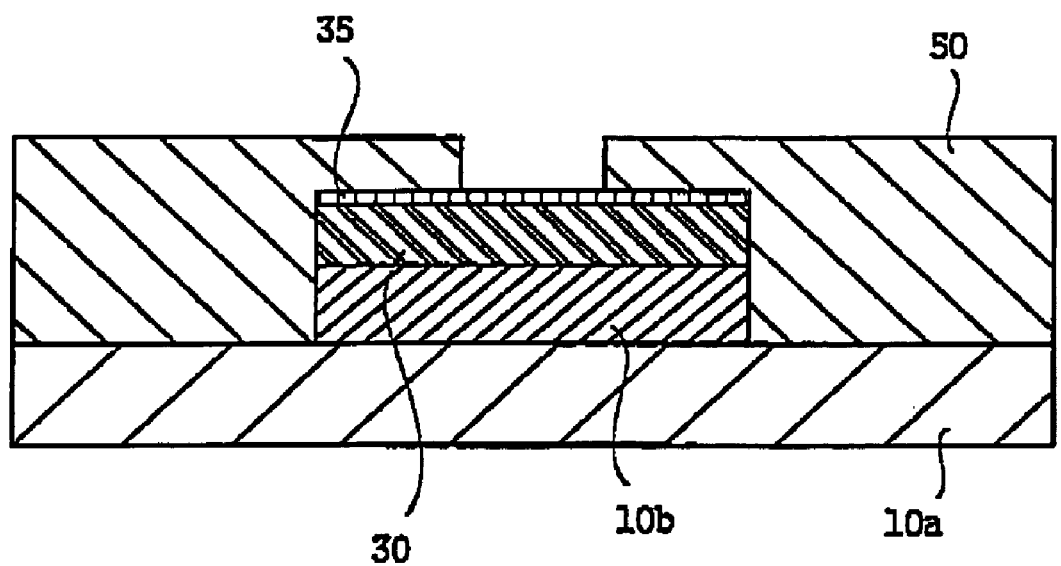

FIGS. 4 to 6 and 10 to 17 are layout and cross-sectional diagrams, respectively, of an example fin transistor provided by an example fabrication method. First, a mask oxide layer 30 and a thin nitride layer 35 are sequentially deposited on an SOI substrate 10 or 10a and 10b. Referring to FIGS. 10 and 14, the nitride layer 35, the mask oxide layer 30, and the silicon 10b are then etched to form a fin, and an insulating oxide layer 50 is deposited over the SOI substrate 10. The insulating oxide layer 50 corresponding to a gate forming area is then etched, as shown in FIGS. 11 and 15, to form a gate electrode 70 using a gate mask 2 as an etch mask.

Figure 1:
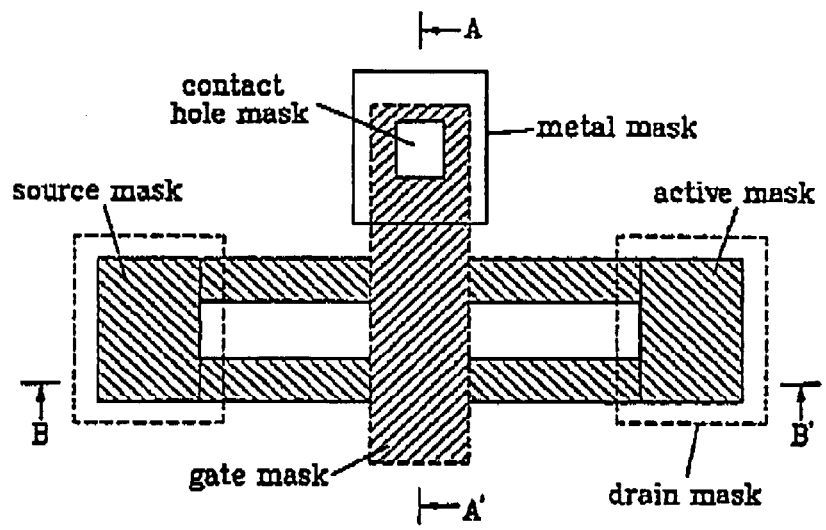
FIGS. 1 to 3 are layout and cross-sectional diagrams, respectively, of a known fin transistor.
Figure 2:
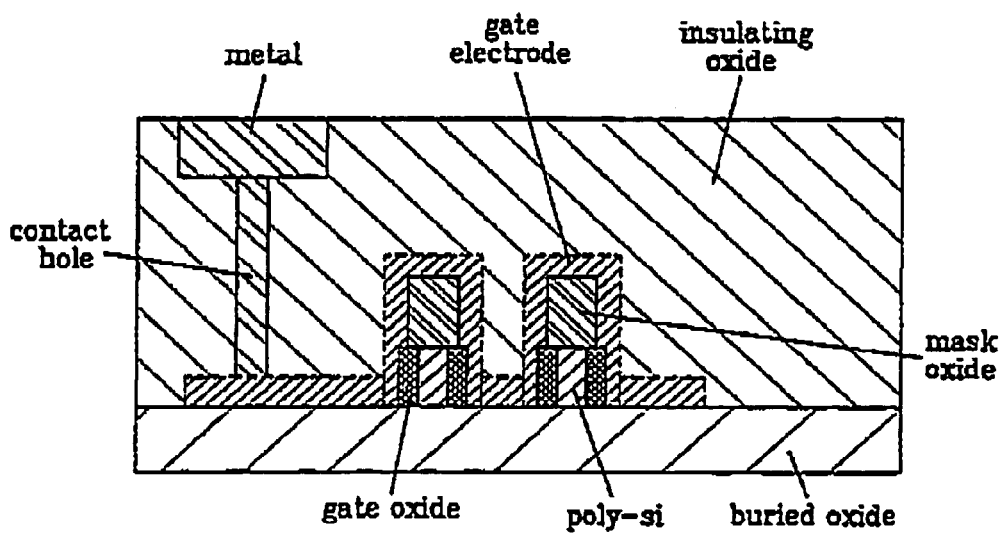
Figure 3:
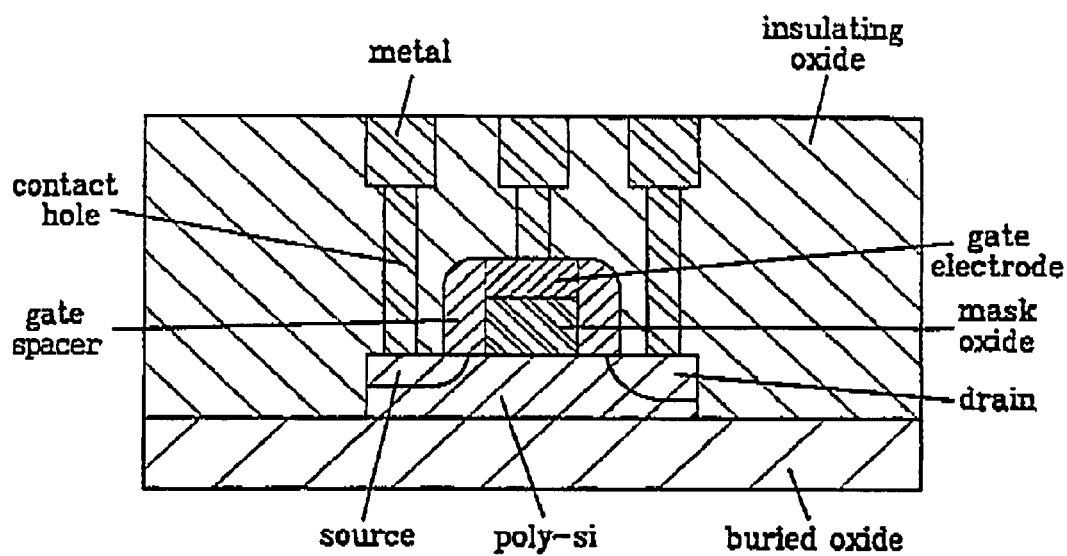
Figure 4:
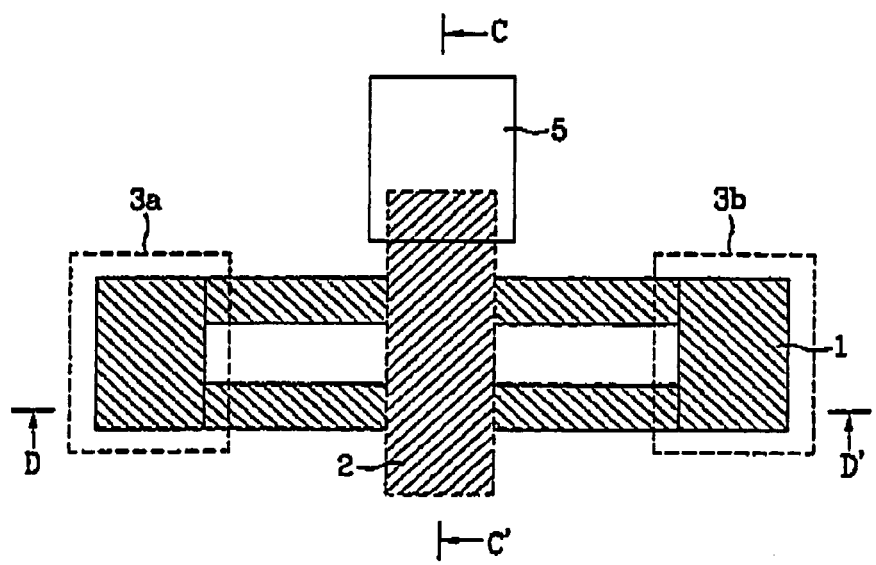
FIGS. 4 to 6 are layout and cross-sectional diagrams, respectively, of an example fin transistor provided by an example fabrication method.
Figure 5:
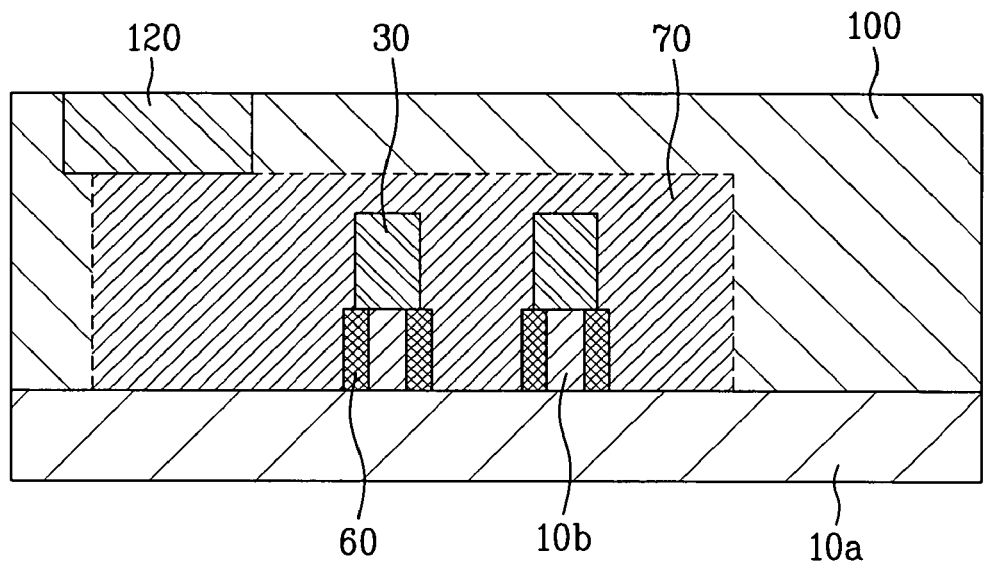
Figure 6:
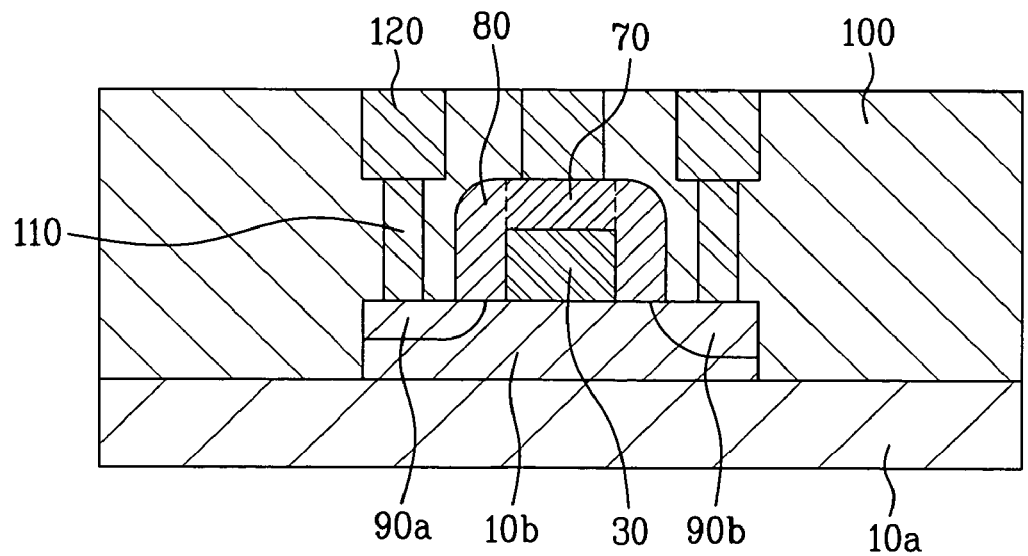
Figure 16:
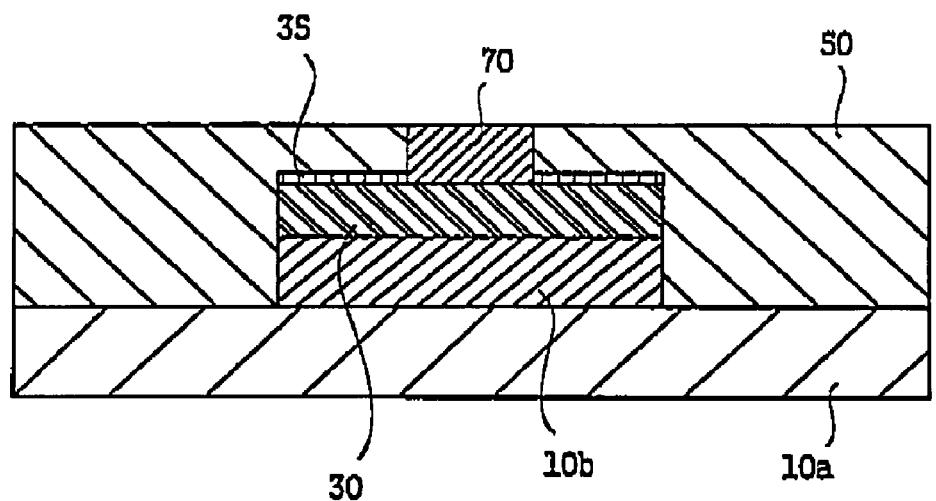
Figure 17:
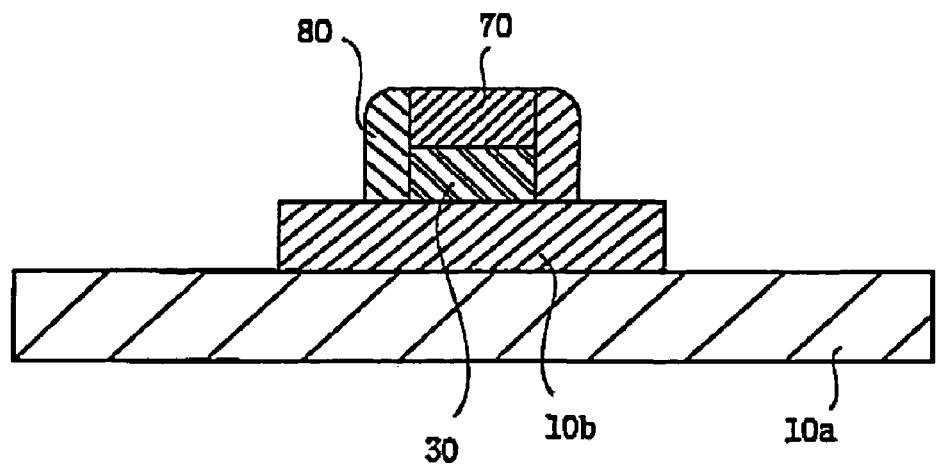

A gate oxide layer 60 is formed on a sidewall of the silicon 10b exposed by the etching as shown in FIG. 12, and a metal is buried therein to form a gate electrode 70 as shown in FIGS. 13 and 16. In doing so, the insulating oxide layer 50 corresponding to the gate forming area is etched using the gate mask 2 having a contact hole type, and the metal is buried in the etched portion. Moreover, the etched portion is filled up with W or Mo to form the gate electrode 70. Because the metal is buried in the etched portion using the contact hole type gate mask 2, to gate electrode 70, as shown in FIG. 5, can be directly connected to an upper metal without a contact hole. Subsequently, the remaining insulating oxide layer 50 is removed using an etch rate difference, and a gate spacer 80 is formed as shown in FIG. 17.

Source/drain regions 90a and 90b are formed in the silicon substrate 10b to be aligned with the gate electrode 70 by high dose ion implantation. After forming the source/drain regions 90a and 90b, another insulating oxide layer 100 is deposited, and the insulating oxide layer 100 is etched such that trenches 120 are formed over the source/drain regions 90a and 90b using metal masks 3a and 3b (see FIG. 4) and over the gate electrode 70 by using a metal mask 5, and contact holes 110 are formed on the source/drain regions 90a and 90b, respectively. Subsequently, metals 120 and 110 are buried in the contact holes 110 on the source/drain regions 90a and 90b and the etched portion via the metal mask 5 (e.g., trench 120 exposing gate electrode 70). Finally, the metal 120 is planarized by CMP (chemical mechanical polishing) to form the metal plug 120.

Figure 7:
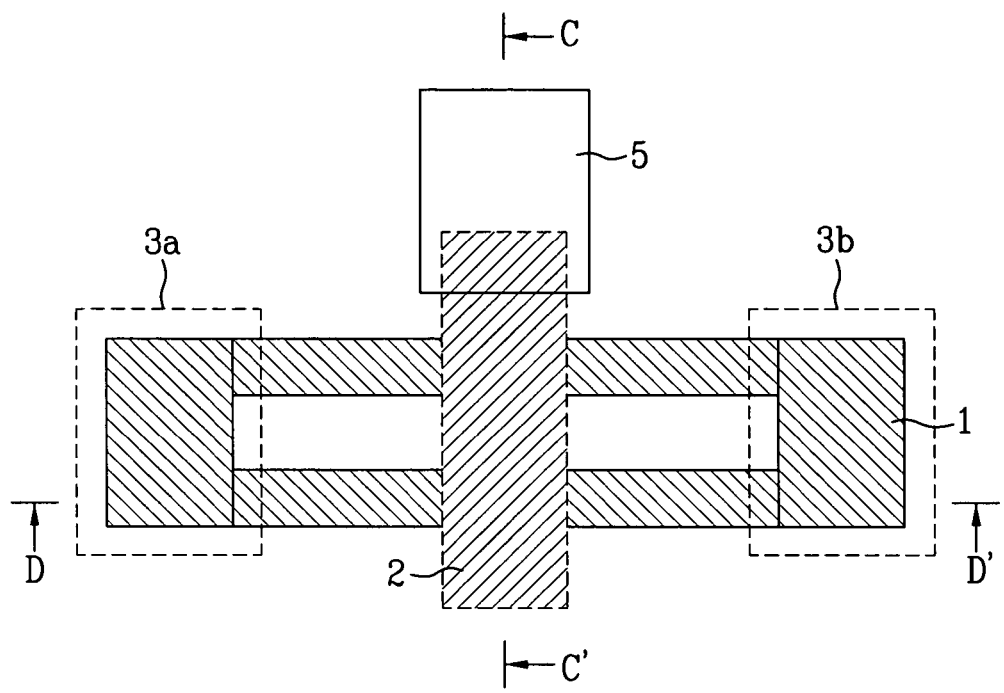
FIGS. 7 to 9 are layout and cross-sectional diagrams, respectively, of another example fin transistor provided by another example fabrication method.
Figure 8:
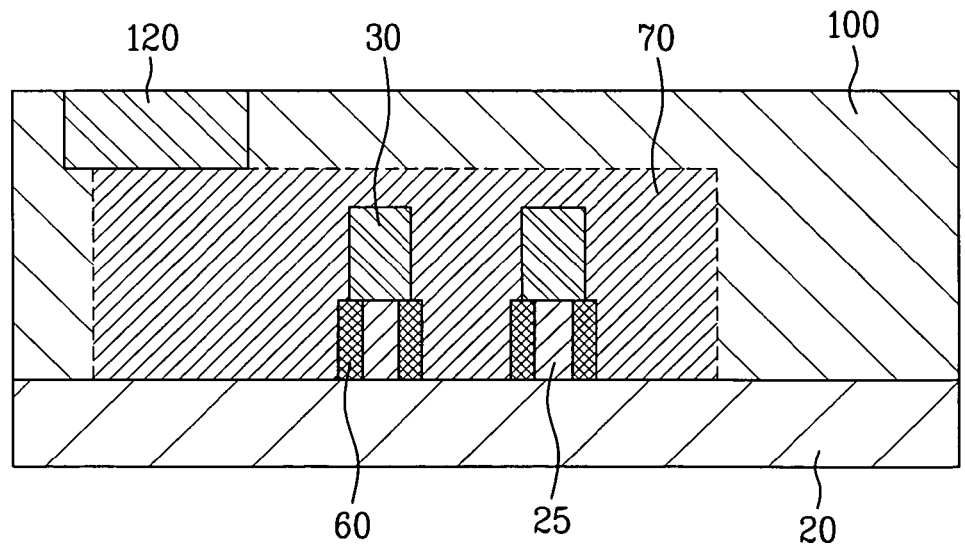
Figure 9:
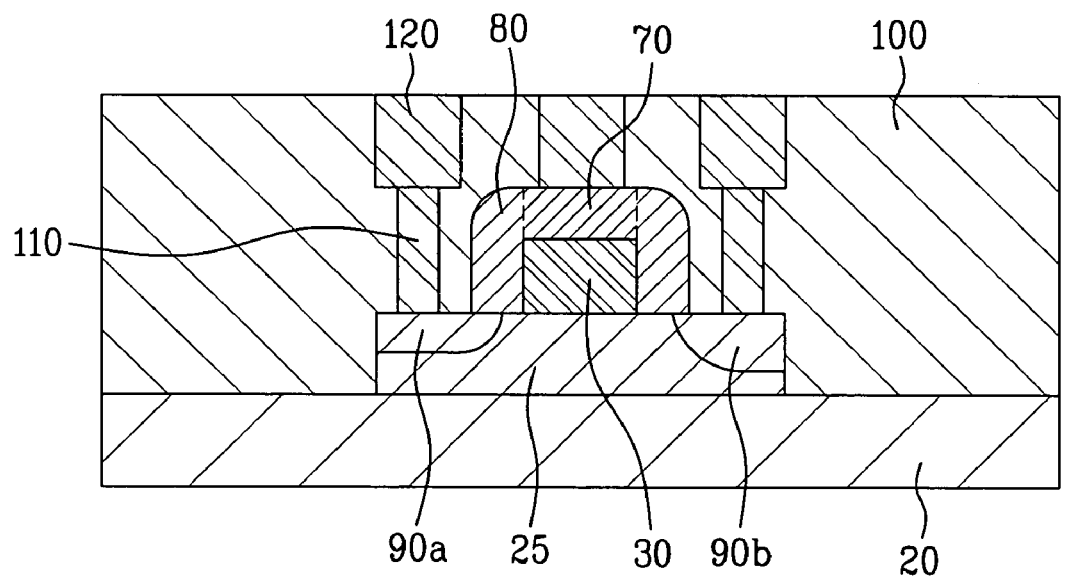

FIGS. 7 to 9 are layout and cross-sectional diagrams, respectively, of an example fin transistor provided by an example fabrication method. First, a buried oxide layer 20 is deposited on a first conductive type silicon substrate and a polysilicon 25 is deposited thereon. Additionally, a mask oxide layer 30 and a thin nitride layer are sequentially deposited thereon. After the nitride layer, the mask oxide layer 30, and the polysilicon 25 are etched to form a fin, and an insulating oxide layer 50 is then deposited thereon.

The insulating oxide layer 50 corresponding to a gate forming area is etched to form a gate electrode 70 using a gate mask 2 as an etch mask. A gate oxide layer 60 is formed on a sidewall of the polysilicon 25 exposed by the etching, and a metal is buried therein to form a gate electrode 70. In doing so, the insulating oxide layer 50 corresponding to the gate forming area is etched using the gate mask 2 having a contact hole type, and the metal is buried in the etched portion. Moreover, the etched portion is filled up with W or Mo to form the gate electrode 70. Because the metal is buried in the etched portion using the contact hole type gate mask 2, the gate electrode 70, as shown in FIG. 8, can be directly connected to an upper metal without a contact hole. Subsequently, the remaining insulating oxide layer 50 is removed using an etch rate difference, and a gate spacer 80 is formed. Source/drain regions 90*a* and 90*b* are formed in the silicon substrate 10*b* to be aligned with the gate electrode 70 by high dose ion implantation.

After forming the source/drain regions 90*a* and 90*b*, another insulating oxide layer 100 is deposited, and the insulating oxide layer 100 is etched using a metal mask 5. Contact holes 110 are formed on the source/drain regions 90*a* and 90*b*, respectively. Subsequently, metals 120 and 110 are buried in the contact holes 110 on the source/drain regions 90*a* and 90*b* and the etched portion via the metal mask 5. Finally, the metal 120 is planarized by CMP (chemical mechanical polishing) to form the metal plug 120.

Accordingly, using the example fabrication methods described herein, the insulating oxide layer corresponding to the gate forming area is etched using the gate mask, the metal is buried in the etched portion, the insulating layer is etched using the metal mask, the contact holes are formed on the source/drain regions, respectively, and the metals are then buried. As a result, the gate electrode can be directly connected to the upper metal without its contact hole, thereby facilitating the fabrication of highly integrated transistors and, thus, the number of die per wafer.

While the examples herein have been described in detail with reference to example embodiments, it is to be understood that the coverage of this patent is not limited to the disclosed embodiments, but, on the contrary, is intended to cover various modifications and equivalent arrangements included within the sprit and scope of the appended claims.

What is claimed is:

1. A method of fabricating a fin transistor, comprising:
   forming a silicon layer, a mask oxide layer and a nitride layer on a substrate;
   forming a fin by etching the nitride and mask oxide layers and silicon layer;
   forming a first insulating oxide layer;
   etching the first insulating oxide layer corresponding to a gate forming area using a gate mask to expose the fin;
   forming a gate oxide layer on a sidewall of the silicon layer exposed by the etch;
   filling the etched portion of the first insulating oxide layer with a first metal to form a gate electrode;
   removing the remaining first insulating oxide layer;
   forming a gate spacer;
   forming source/drain regions in the silicon layer aligned with the gate electrode;
   forming a second insulating oxide layer over the substrate;
   etching the second insulating oxide layer using a metal mask to form a trench exposing the gate electrode and to form trenches over the source/drain regions;
   forming contact holes on the source/drain regions; and
   filling the contact holes and the trenches with a second metal.

2. The method of claim 1, wherein the substrate is an SOI substrate.

3. The method of claim 1, wherein the gate mask is a contact hole type mask.

4. The method of claim 1, wherein the first metal comprises W or Mo.

5. The method of claim 1, wherein the width of the trenches is greater than the width of the contact holes.

6. The method of claim 1, further comprising planarizing the second metal.

7. The method of claim 6, wherein planarizing the second metal comprises a Chemical Mechanical Polishing (CMP) process.

8. The method of claim 1, wherein the substrate comprises a first conductive type silicon substrate, a buried oxide layer on the first conductive type silicon substrate, and a polysilicon layer on the buried oxide layer.

9. The method of claim 1, wherein forming the source/drain regions comprises high dose ion implantation.

* * * * *